US009184559B2

(12) United States Patent
Yamaguchi et al.

(10) Patent No.: US 9,184,559 B2
(45) Date of Patent: Nov. 10, 2015

(54) ELECTRON-BEAM-PUMPED LIGHT SOURCE

(75) Inventors: Masanori Yamaguchi, Hyogo (JP); Ken Kataoka, Hyogo (JP); Tsuyoshi Maesoba, Hyogo (JP); Hiroyuki Takada, Hyogo (JP); Hiroshige Hata, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 250 days.

(21) Appl. No.: 13/884,820

(22) PCT Filed: Oct. 11, 2011

(86) PCT No.: PCT/JP2011/073292
§ 371 (c)(1),
(2), (4) Date: Aug. 20, 2013

(87) PCT Pub. No.: WO2012/063585
PCT Pub. Date: May 18, 2012

(65) Prior Publication Data
US 2013/0322484 A1    Dec. 5, 2013

(30) Foreign Application Priority Data

Nov. 10, 2010 (JP) ................ 2010-251682
Nov. 10, 2010 (JP) ................ 2010-251683
Nov. 10, 2010 (JP) ................ 2010-251684

(51) Int. Cl.
*H01J 1/62* (2006.01)
*H01J 63/04* (2006.01)
(Continued)

(52) U.S. Cl.
CPC .............. *H01S 5/041* (2013.01); *B82Y 20/00* (2013.01); *H01J 63/02* (2013.01); *H01J 63/06* (2013.01); *H01S 5/04* (2013.01); *H01S 5/02208* (2013.01); *H01S 5/34333* (2013.01)

(58) Field of Classification Search
CPC ....... H01S 5/041; H01S 5/04; H01S 5/02208; H01S 5/3433; H01J 63/06; H01J 63/02; B82Y 20/00

USPC ............................................. 313/499; 372/74
See application file for complete search history.

(56) References Cited

U.S. PATENT DOCUMENTS 5,125,000 A * 6/1992 Labrunie et al. ............... 372/75
2006/0163998 A1* 7/2006 Tiberi et al. ............... 313/477 R
(Continued)

FOREIGN PATENT DOCUMENTS

JP     09-214027 A    8/1997
JP     2001-015840 A  1/2001
(Continued)

OTHER PUBLICATIONS

International Search Report, mailed Nov. 8, 2011.

*Primary Examiner* — Anne Hines
*Assistant Examiner* — Jose M Diaz
(74) *Attorney, Agent, or Firm* — Michael Best & Friedrich LLP

(57) ABSTRACT

The present invention is intended to provide an electron-beam-pumped light source capable of irradiating one surface of a semiconductor light-emitting device uniformly with an electron beam, and capable of obtaining a high light output without increasing an accelerating voltage of the electron beam and, in addition, capable of efficiently cooling the semiconductor light-emitting device. An electron-beam-pumped light source of the present invention includes: an electron beam source and a semiconductor light-emitting device excited by an electron beam emitted from the electron beam source, and characterized in that the electron beam source includes a planar electron beam emitting portion and arranged in the periphery of the semiconductor light-emitting device, and light exits from a surface through which the electron beam from the electron beam source of the semiconductor light-emitting device enters.

11 Claims, 8 Drawing Sheets

(51) Int. Cl.
*H01S 5/04* (2006.01)
*B82Y 20/00* (2011.01)
*H01J 63/02* (2006.01)
*H01J 63/06* (2006.01)
*H01S 5/022* (2006.01)
*H01S 5/343* (2006.01)

(56) References Cited

U.S. PATENT DOCUMENTS

| | | | |
|---|---|---|---|
| 2007/0036194 A1* | 2/2007 | Govorkov et al. | 372/57 |
| 2008/0175289 A1* | 7/2008 | Tiberi et al. | 372/44.01 |
| 2009/0079976 A1* | 3/2009 | Cunningham et al. | 356/246 |
| 2010/0111124 A1* | 5/2010 | Hoffman | 372/43.01 |
| 2012/0161609 A1* | 6/2012 | Ono et al. | 313/497 |
| 2013/0294467 A1* | 11/2013 | Moloney et al. | 372/20 |

FOREIGN PATENT DOCUMENTS

| | | |
|---|---|---|
| JP | 3667188 B2 | 7/2005 |
| JP | 2006-261150 A | 9/2006 |
| JP | 04-096281 A | 10/2006 |
| JP | 2006-287028 A | 10/2006 |
| WO | WO-2007/023832 A1 | 3/2007 |

* cited by examiner (a)

(b)

(a)

(b)

(a)

(b)

(a)

(b)

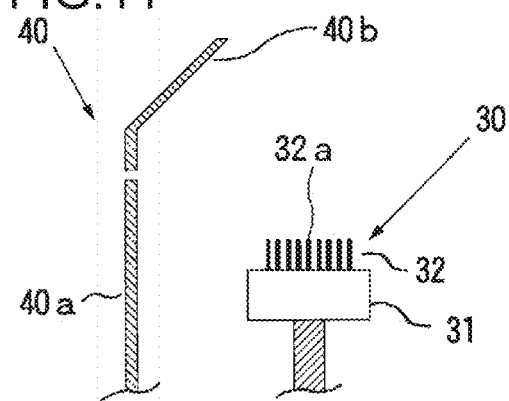
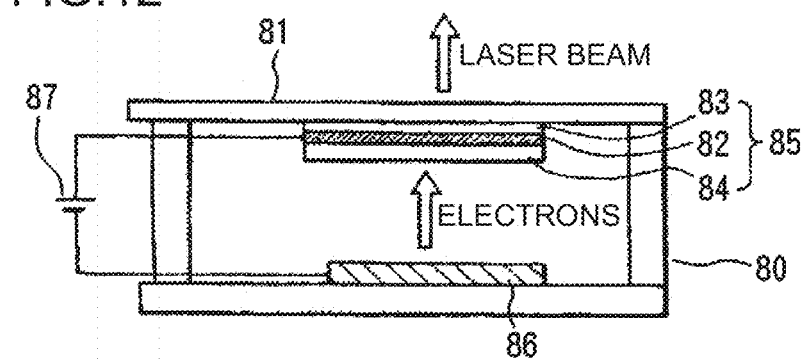

ELECTRON-BEAM-PUMPED LIGHT SOURCE

TECHNICAL FIELD

The present invention relates to an electron-beam-pumped light source including an electron beam source and a semiconductor light-emitting device excited by an electron beam emitted from the electron beam source.

BACKGROUND ART

An electron-beam-pumped light source configured to cause a semiconductor light-emitting device to emit light by emitting an electron beam is expected as a compact light source having high-output ultraviolet rays.

FIG. 12 is an explanatory cross-sectional view illustrating a schematic configuration of an example of an electron-beam-pumped light source of the related art. The electron-beam-pumped light source is configured to emit laser beams, includes a vacuum container 80 hermetically sealed in a state of a negative pressure in the interior thereof and having a light transmitting window 81. In the vacuum container 80, a laser structure 85 including light reflecting members 83, 84 arranged on both surfaces of a semiconductor light-emitting device 82 is arranged on an inner surface of the light transmitting window 81 thereof, and an electron beam source 86 configured to irradiate the semiconductor light-emitting device 82 with an electron beam is arranged on an inner surface of a bottom wall of the vacuum container 80 so as to face the laser structure 85. The semiconductor light-emitting device 82 and the electron beam source 86 are electrically connected to electron accelerating means 87 provided outside of the vacuum container 80 and configured to apply an accelerating voltage. The electron-beam-pumped light source having such the configuration is disclosed in Patent Literature 1.

In the electron-beam-pumped light source described above, electrons emitted from the electron beam source 86 are accelerated by the accelerating voltage applied between the semiconductor light-emitting device 82 and the electron beam source 86 and are formed into an electron beam, light exits from the semiconductor light-emitting device 82 by the electron beam entering the semiconductor light-emitting device 82 via the light reflecting member 84, and the light exits outside as a laser beam through the light transmitting window 81 by being resonated by the light reflecting members 83, 84.

However, in the electron-beam-pumped light source described above, the semiconductor light-emitting device 82 generates heat by being irradiated with the electron beam, and since of the two surfaces of the semiconductor light-emitting device 82 that have a large surface area, one is used as a light-emitting surface and the other surface thereof is used as an electron beam incident surface, the semiconductor light-emitting device 82 is not capable of being cooled from a surface having a large surface area. Hence it is difficult to cool the semiconductor light-emitting device 82 efficiently. Consequently, there are problems that the semiconductor light-emitting device 82 generates heat at a high temperature, whereby luminous efficiency of the semiconductor light-emitting device 82 is lowered and hence high output light is not emitted, and the semiconductor light-emitting device 82 may be broken by heat generation in an early stage.

Also, one means contemplated for obtaining higher light output is increasing the accelerating voltage for the electron beam. However, when the accelerating voltage for the electron beam is increased, there arises a problem that an X-ray is generated from the semiconductor light-emitting device 82.

Also, another means contemplated for obtaining greater light output is increasing a voltage to be applied to the electron beam source 86. However, when the voltage to be applied to the electron beam source 86 is increased, there is a problem that the electron beam source 86 generates heat and breaks in an early stage.

In order to solve the above-described problems, there is proposed an electron-beam-pumped light source configured to cause an electron beam incident on one surface of the semiconductor light-emitting device by an electron gun from a direction oblique thereto so that light exits from the one surface of the semiconductor light-emitting device where the electron beam is incident (see Patent Literature 2). According to the electron-beam-pumped light source, since the semiconductor light-emitting device may be cooled efficiently from a back surface thereof, the semiconductor light-emitting device can be cooled efficiently, and hence a high light output is maintained without lowering the luminous efficiency of the semiconductor light-emitting device.

However, in the electron-beam-pumped light source as described above, since the electron gun is used for irradiating the semiconductor light-emitting device with the electron beam, the one surface of the semiconductor light-emitting device cannot be irradiated with the electron beam uniformly, that is, the one surface of the semiconductor light-emitting device is irradiated with the electron beam locally in an intensive manner, so that there arises a problem that the semiconductor light-emitting device is deteriorated in an early stage.

CITATION LIST

Patent Literature

Patent Literature 1: Japanese Patent No. 3667188
Patent Literature 2: JP-A-09-214027

SUMMARY OF INVENTION

Technical Problem

In view of such circumstances, it is an object of the present invention to provide an electron-beam-pumped light source capable of irradiating one surface of a semiconductor light-emitting device uniformly with an electron beam, and capable of obtaining a high light output without increasing an accelerating voltage of the electron beam and, in addition, capable of efficiently cooling the semiconductor light-emitting device.

In addition to the object described above, it is another object of the present invention to provide an electron-beam-pumped light source capable of efficiently irradiating one surface of the semiconductor light-emitting device with an electron beam.

In addition to the above-described objects, it is further another object of the present invention to provide an electron-beam-pumped light source capable of obtaining a high light output without increasing a voltage applied to an electron beam source.

Solution to Problem

The electron-beam-pumped light source according to the present invention is an electron-beam-pumped light source including: an electron beam source and a semiconductor light-emitting device excited by an electron beam emitted from the electron beam source, characterized in that the electron beam source includes a planar electron beam emitting portion and arranged in the periphery of the semiconductor light-emitting device, and light exits from a surface which the electron beam from the electron beam source of the semiconductor light-emitting device enters.

In the electron-beam-pumped light source according to the present invention, it is preferable that the electron beam emitting portion is formed of a carbon nanotube.

Also, it is preferable that the electron beam source is arranged so as to surround the semiconductor light-emitting device.

Also, the electron beam source may be formed of an annular band-shaped member surrounding the semiconductor light-emitting device.

Also, a plurality of the electron beam sources may be arranged so as to interpose the semiconductor light-emitting device therebetween.

Also, a plurality of the electron beam sources including partial annular band-shaped members respectively may be arranged so as to surround the semiconductor light-emitting device.

In the electron-beam-pumped light source according to the present invention, it is preferable that an electrode for electric field control configured to direct a trajectory of the electron beam emitted from the electron beam source toward a surface of the semiconductor light-emitting device from which light exits is provided.

In such an electron-beam-pumped light source, it is preferable that a height of the surface of the semiconductor light-emitting device which the electron beam enters is a height displaced from the surface of the electron beam emitting portion from which the electron beam exits in the direction of emission of the light from the semiconductor light-emitting device.

Also, it is preferable that the electrode for electric field control is arranged outward of the electron beam source with respect to the semiconductor light-emitting device, and a negative voltage is applied to the electron beam source.

Also, in the electron-beam-pumped light source according to the present invention, it is preferable that electron radiant quantity emitted from the electron beam emitting portion is 25 mA/cm$^2$ or smaller.

In such an electron-beam-pumped light source, it is preferable that the surface area of a surface of the electron beam emitting portion from which the electron beam exits is larger than the surface area of the surface of the semiconductor light-emitting device which the electron beam enters.

Advantageous Effects of Invention

According to the electron-beam-pumped light source of the present invention, the electron beam source having the planar electron beam emitting portion is arranged in the periphery of the semiconductor light-emitting device. Therefore, one surface of the semiconductor light-emitting device is irradiated uniformly with the electron beam and hence the high output light may be obtained without increasing the accelerating voltage of the electron beam. In addition, since the light exits from the surface where the electron beam from the electron beam source in the semiconductor light-emitting device enters, the semiconductor light-emitting device may be cooled from the other surface of the semiconductor light-emitting device. Therefore, since the semiconductor light-emitting device may be cooled efficiently, lowering of the luminous efficiency of the semiconductor light-emitting device is avoided, and high light output is maintained.

Also, regarding a configuration including an electrode for electric field control configured to direct the trajectory of the electron beam emitted from the electron beam source toward the surface of the semiconductor light-emitting device from which light exits, since the trajectory of the electron beam emitted from the electron beam source may be directed toward the one surface of the semiconductor light-emitting device from which light exits by the electrode for electric field control, the electron beam may enter the one surface of the semiconductor light-emitting device at a high efficiency, whereby a high light output is obtained without increasing the accelerating voltage of the electron beam.

Also, by keeping the electron radiant quantity emitted from the electron beam emitting portion to 25 mA/cm$^2$ or lower, a high output light may be obtained without increasing the voltage to be applied to the electron beam source.

Also, since the surface area of the surface from which the electron beam of the electron beam emitting portion exits is larger than the surface area of the surface which the electron beam of the semiconductor light-emitting device enters, the electron beam emitted from the electron beam emitting portion has a high electron density when entering the semiconductor light-emitting device, so that higher light output is obtained without increasing the accelerating voltage.

BRIEF DESCRIPTION OF THE DRAWINGS

FIG. 11 is an explanatory cross-sectional view illustrating a modification of an electrode for electric field control.

FIG. 12 is an explanatory cross-sectional view illustrating a schematic configuration of an example of an electron-beam-pumped light source of the related art.

DESCRIPTION OF EMBODIMENTS

First Embodiment

Figure 1:
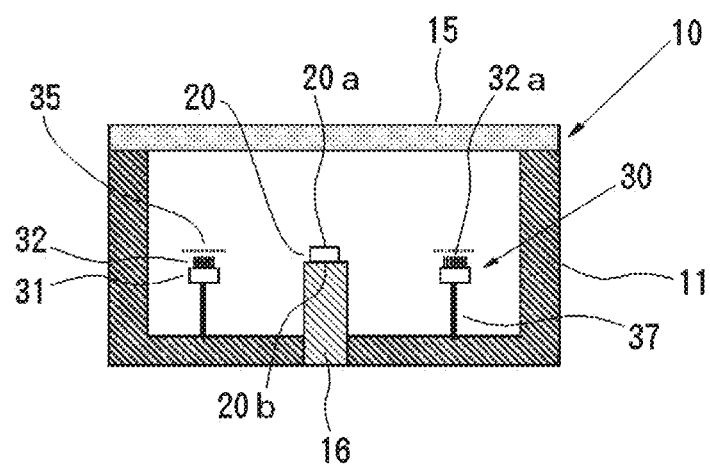
FIG. 1 is an explanatory drawing illustrating a schematic configuration of an electron-beam-pumped light source according to a first embodiment of the present invention, in which (a) is a cross-sectional side view, and (b) is a plan view illustrating a state in which a light transmitting window is removed.
Figure 1:
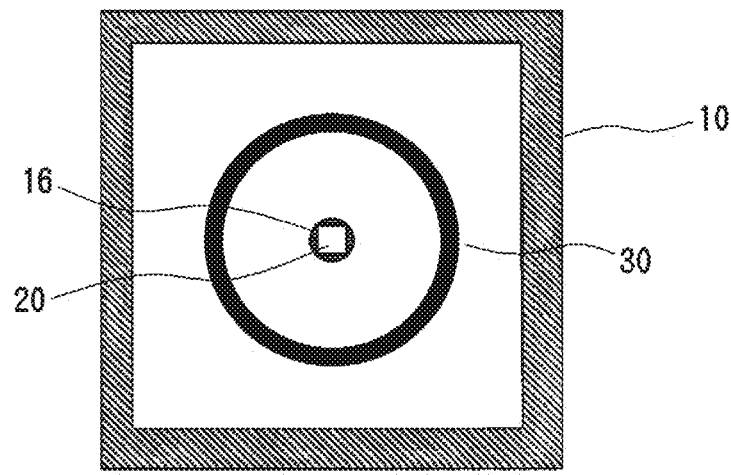

FIG. 1 is an explanatory drawing illustrating a schematic configuration of an electron-beam-pumped light source according to a first embodiment of the present invention, in which (a) is a cross-sectional side view, and (b) is a plan view illustrating a state in which a light transmitting window is removed.

The electron-beam-pumped light source includes a vacuum container 10 being sealed in a hermetic manner in a state of a negative pressure in the interior thereof and having an outline of a parallelepiped, and includes a container base 11 having an opening on one surface (an upper surface in FIG. 1(a)), and a light transmitting window 15 arranged on the opening of the container base 11 and sealing the container base 11 in an air-tight manner.

A semiconductor light-emitting device 20 is arranged in the vacuum container 10 so that a front surface 20a (an upper surface in FIG. 1(a)) thereof is arranged so as to face the light transmitting window 15 at a distance therefrom, and an electron beam source 30 including a planar electron beam emitting portion 32 formed on a supporting substrate 31 is arranged in a peripheral area of the semiconductor light-emitting device 20, specifically, in an area in the proximity of the semiconductor light-emitting device 20 other than a portion in an area on the front surface 20a and an area on a back surface 20b of the semiconductor light-emitting device 20 so as to surround the semiconductor light-emitting device 20. Specifically, the electron beam source 30 is formed of an annular band-shaped member, and is arranged so as to surround the semiconductor light-emitting device 20 in a posture in which a front surface 32a of the electron beam emitting portion 32 from which the electron beam exits faces the same direction as the front surface 20a of the semiconductor light-emitting device 20, that is, faces the light transmitting window 15 of the vacuum container 10 and, in this state, is fixed to a bottom wall of the container base 11 in the vacuum container 10 via a supporting member 37. The semiconductor light-emitting device 20 and the electron beam source 30 are electrically connected to electron accelerating means (not illustrated) for applying an accelerating voltage provided outside of the vacuum container 10 via a conductive line (not illustrated) drawn out from the interior to the outside of the vacuum container 10. Also, the semiconductor light-emitting device 20 is fixed to the bottom wall of the container base 11 of the vacuum container 10 via a high-temperature conducting member 16 provided on the back surface 20b thereof.

As a material which constitutes the container base 11 of the vacuum container 10, insulating materials such as, for example, glass such as quartz glass or ceramics such as alumina may be used.

Also, as a material which constitutes the light transmitting window 15 of the vacuum container 10, those which allow passage of light from the semiconductor light-emitting device 20 therethrough, may be used and, for example, quartz glass or sapphire may be used.

Also, the pressure in the interior of the vacuum container 10 is, for example, $10^{-4}$ to $10^{-6}$ Pa.

As an example of dimensions of the vacuum container 10, the outer dimensions of the container base 11 is 40 mm×40 mm×20 mm, the thickness of the container base 11 is 2 mm, the opening of the container base 11 is 36 mm×36 mm and dimensions of the light transmitting window 15 are 40 mm×40 mm×2 mm.

As a material which constitutes the high-temperature conducting member 16, high-temperature conducting metal such as copper or diamond, for example, may be used.

Figure 2:
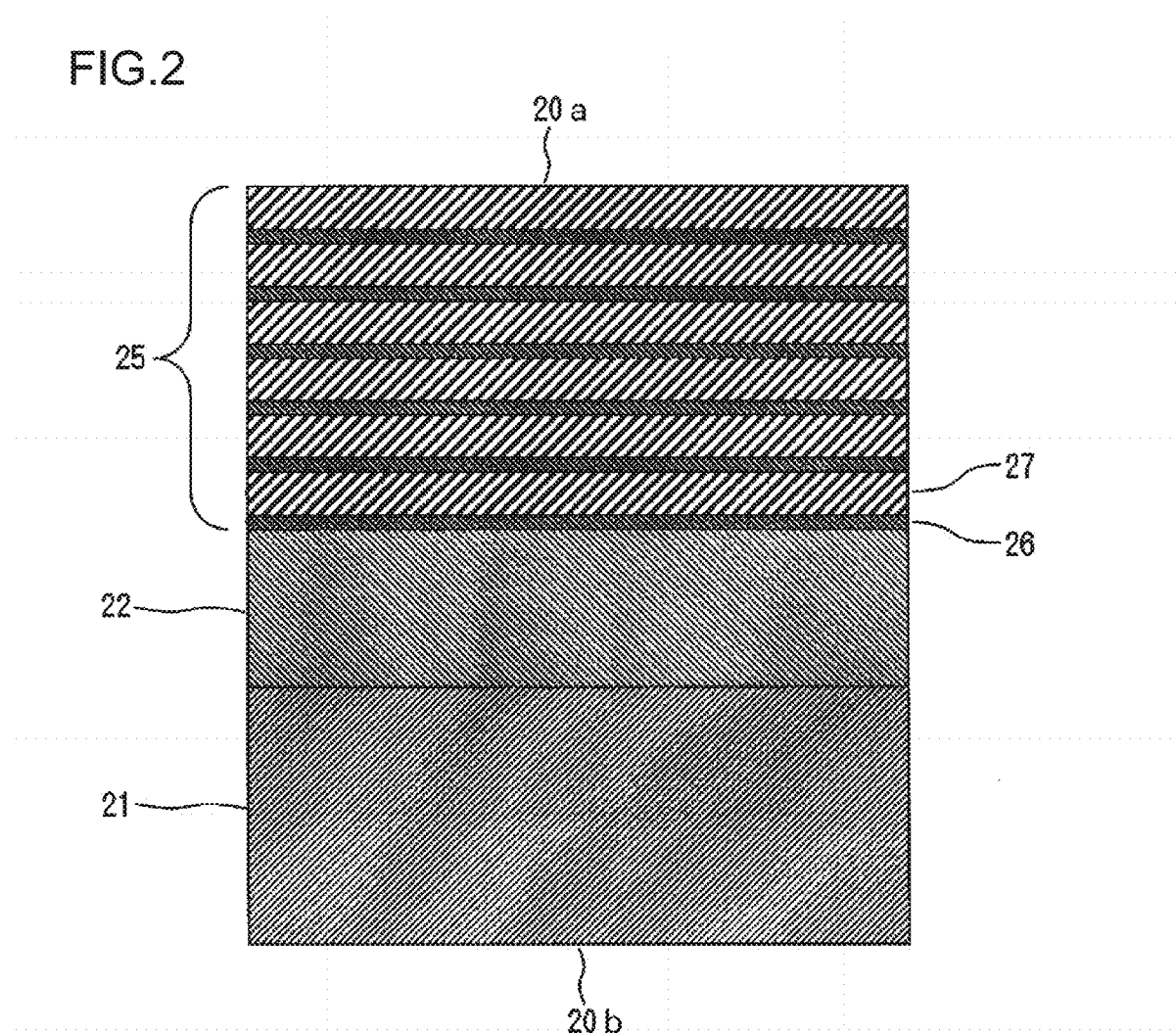
FIG. 2 is an explanatory cross-sectional view illustrating a configuration of a semiconductor light-emitting device in the electron-beam-pumped light source according to the first embodiment.

The semiconductor light-emitting device 20 includes a substrate 21 formed of, for example, sapphire, as illustrated in FIG. 2, a buffer layer 22 formed of, for example, AlN formed on one surface of the substrate 21, and an active layer 25 formed on one surface of the buffer layer 22 and having a single quantum well structure or a multi quantum well structure.

The substrate 21 of the semiconductor light-emitting device 20 in this example is joined to the high-temperature conducting member 16 by blazing or the like in a state in which the active layer 25 faces the light transmitting window 15 of the vacuum container 10.

The thickness of the substrate 21 is, for example, 10 to 1000 μm, and the thickness of the buffer layer 22 is, for example, 100 to 1000 nm.

Also, the distance between the active layer 25 and the electron beam source 30 of the semiconductor light-emitting device 20 is, for example, 5 to 15 mm.

Also, the distance between the front surface 20a of the semiconductor light-emitting device 20 from which light exits and the inner surface of the light transmitting window 15 is, for example, 3 to 25 mm.

The active layer 25 has the single quantum well structure or the multi quantum well structure each composed of $In_xAl_yGa_{1-x-y}N$ (0≤x<1, 0<y≤1, x+y≤1), and including laminating a single or plural quantum well layers 26 and a single or plural barrier layers 27 alternately on the buffer layer 22 in this order.

The thickness of each of the quantum well layers 26 is, for example, 0.5 to 50 nm. Also, the barrier layers 27 each have a composition selected so that the width of a band gap thereof is larger than that of the quantum well layer 26 and, for example, AlN may be used. The thickness of the respective layers is set to be larger than the width of the well of the quantum well layer 26 and specifically, for example, 1 to 100 nm.

The cycle of the quantum well layer 26 which constitutes the active layer 25 is set as needed by considering an entire thickness of the quantum well layer 26, the barrier layers 27 and the active layer 25 and the accelerating voltage of the electron beam used is normally 1 to 100.

The semiconductor light-emitting device 20 described above may be formed by, for example, the MOCDV method (organic metal gas phase growth method). Specifically, the buffer layer 22 composed of AlN having a required thickness is formed by using carrier gas composed of hydrogen and nitrogen and raw material gas composed of trimethylaluminum and ammonia and growing a gas phase on the surface of the substrate 21 (0001) formed of sapphire, then the active layer 25 having the single quantum well structure or the multi quantum well structure composed of $In_xAl_yGa_{1-x-y}N$ ($0 \leq x < 1$, $0 < y \leq 1$, $x+y \leq 1$) having a required thickness by using carrier gas composed of hydrogen gas and nitrogen gas, and raw material gas composed of trimethylaluminum, trimethylgallium, trimethylindium, and ammonia, and growing a gas phase on the buffer layer 22, whereby the semiconductor light-emitting device 20 is formed.

In respective forming steps for forming the buffer layer 22, the quantum well layer 26, and the barrier layers 27 described above, conditions such as the processing temperature, the processing pressure, and the growing speeds of the respective layers are set as needed depending on the composition or the thickness or the like of the buffer layer 22, the quantum well layer 26, and the barrier layers 27 to be formed.

Also, when forming the quantum well layer 26 formed of InAlGaN, trimethylindium may be used in addition to the above-described substances as the raw material gas, and the processing temperature may be set to be lower than that in a case of forming the quantum well layer 26 formed of AlGaN.

Also, the method of forming the semiconductor multilayer film is not limited to MOCVD method and, for example, the MBE method (molecular beam epitaxy) may be used.

Figure 3:
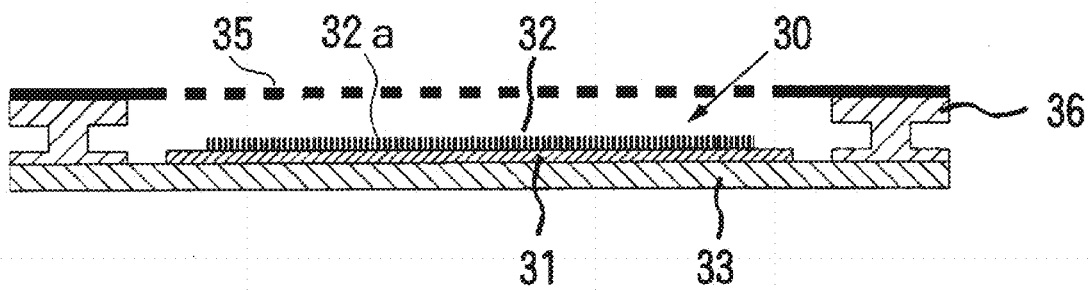
FIG. 3 is an explanatory cross-sectional view illustrating a configuration of an electron beam source in the electron-beam-pumped light source according to the first embodiment.

As illustrated in FIG. 3, the electron beam emitting portion 32 of the electron beam source 30 is formed by supporting a number of carbon nanotubes on the supporting substrate 31, and the supporting substrate 31 which is melted by the electron beam source 30 is fixed to a plate-shaped base 33. Also, a net-like extraction electrode 35 for ejecting the electron from the electron beam emitting portion 32 is arranged above the front surface 32a of the electron beam emitting portion 32 of the electron beam source 30 from which the electron beam exits so as to face the electron beam emitting portion 32 at a distance therefrom, and the extraction electrode 35 is fixed to the base 33 via an electrode holding member 36. The supporting substrate 31 and the extraction electrode 35 are electrically connected to a power source for electron beam discharge 51 provided outside the vacuum container 10 so that the extraction electrode 35 becomes a positive pole and the supporting substrate 31 becomes a negative pole via a conductive line (not illustrated) drawn out from the interior to the outside of the vacuum container 10.

The surface area of the front surface 32a of the electron beam emitting portion 32 from which the electron beam exits is preferably larger than the surface area of the front surface 20a of the semiconductor light-emitting device 20 which the electron beam enters. Specifically, the ratio $S_2/S_1$ is preferably 6 or larger, and more preferably, 10 to 30 where $S_1$ is a surface area of the front surface 20a of the semiconductor light-emitting device 20 which the electron beam enters, and $S_2$ is a surface area of the front surface 32a of the electron beam emitting portion 32 where the electron beam exits.

Figure 4:
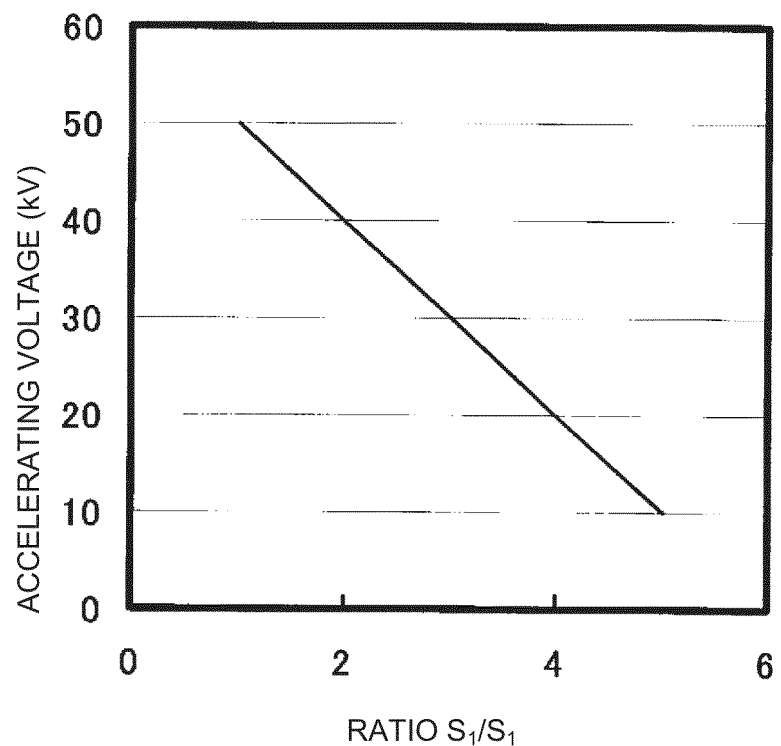
FIG. 4 is a graph showing a relationship between a ratio $s_2/s_1$ of a surface area $S_2$ of a surface of an electron beam emitting portion from which an electron beam exits with respect to a surface area $S_1$ of a surface of the semiconductor light-emitting device which the electron beam enters, and an accelerating voltage required for obtaining an output of light of 1 W.

FIG. 4 is a graph illustrating a relationship the ratio $S_2/S_1$ and the accelerating voltage required for obtaining a light output of 1 W in a case where the semiconductor light-emitting device 20 is irradiated with the electron beam from the electron beam source 30 under the conditions that the electron radiant quantity emitted from the electron beam emitting portion 32 is 10 $mA/cm^2$, and the power efficiency of the semiconductor light-emitting device 20 is 20%. As is clear from the drawing, the accelerating voltage required for obtaining the light output of 1 W is in inverse proportion to the ratio $S_2/S_1$, and the larger the ratio $S_2/S_1$ of the surface area $S_2$ of the front surface 32a of the electron beam emitting portion 32 with respect to the surface area $S_1$ of the front surface 20a of the semiconductor light-emitting device 20, the lower the accelerating voltage may be set. It seems to be because the electron density of the electron beam emitted from the electron beam emitting portion 32 becomes higher in proportion to the ratio $S_2/S_1$ when entering the front surface 20a of the semiconductor light-emitting device 20.

As an example of dimension of the electron beam source 30, the outer diameter of the supporting substrate 31 is 25 mm, the inner diameter is 19 mm, the thickness is 0.1 mm, the outer diameter of the electron beam emitting portion 32 is 24 mm, the inner diameter is 20 mm, the thickness is 0.02 mm, and the surface area of a surface of the electron beam emitting portion 32 from which the electron beam exits is 138 $mm^2$.

As a material which constitutes the supporting substrate 31, metallic material or the like including any one of iron, nickel, cobalt, and chrome may be used.

A method of forming the electron beam emitting portion 32 formed of the carbon nanotube on the supporting substrate 31 is not specifically limited and may be a known method. For example, the Screen Printing Method that involves preparing paste containing powder of carbon nanotube (formed by methods such as the Thermal CVD method or the Arc Discharge Method that accumulates carbon on a metallic catalyst layer formed on the surface of the supporting substrate 31 and forms the carbon nanotube by heating the supporting substrate 31 formed with a metallic catalyst layer on the surface thereof and supplying carbon source gas such as CO and acetylene and organic binder in a liquid medium), and applying the paste to the surface of the supporting substrate 31 and drying the same by screen printing may be suitably used.

Also, as a material which constitutes the extraction electrode 35, a metallic material or the like including, for example, any one of iron, nickel, cobalt, and chrome may be used.

In the electron-beam-pumped light source described above, when the voltage is applied between the electron beam source 30 and the extraction electrode 35, electrons are discharged from the electron beam emitting portion 32 of the electron beam source 30 toward the extraction electrode 35, and these electrons proceed toward the semiconductor light-emitting device 20 while being accelerated by the accelerating voltage applied between the semiconductor light-emitting device 20 and the electron beam source 30, and then enters the front surface 20a of the semiconductor light-emitting device 20, that is, the surface of the active layer 25 as an electron beam. Then, in the semiconductor light-emitting device 20, the electrons of the active layer 25 are excited by the entry of the electron beam, whereby light such as ultraviolet rays exits from the front surface 20a of the semiconductor light-emitting device 20, through which the electron beam entered, to the outside of the vacuum container 10 via the light transmitting window 15 of the vacuum container 10.

In the description given thus far, the electron radiant quantity emitted from the electron beam emitting portion 32 is preferably 25 $mA/cm^2$ or below, and more preferably, 1 to 15 $mA/cm^2$ and, further preferably, 5 to 10 $mA/cm^2$. When the electron radiant quantity exceeds 25 $mA/cm^2$, the voltage applied to the electron beam source 30 needs to be higher correspondingly, and consequently, there may arise a problem that the electron beam source 30 generates heat and hence breaks in an early stage. Also, when the electron beam radiant quantity is excessively small, the front surface 20a of the semiconductor light-emitting device 20 is not irradiated with a sufficient amount of the electron beam, and hence it may be difficult to obtain a high output light.

Also, the voltage applied between the electron beam source 30 and the extraction electrode 35 is preferably from 1 to 5 kV.

When this voltage is excessively low, the electron density of the electron beam emitted from the electron beam emitting portion 32 is small, and hence it may be difficult to obtain the high output light. In contrast, when the voltage is excessively high, the electron beam source 30 may generate heat and hence may be broken in an early stage.

Also, the accelerating voltage of the electron beam is preferably from 6 to 12 kV. When this accelerating voltage is excessively low, the electrons emitted from the electron beam emitting portion 32 are not sufficiently accelerated, and hence it may be difficult to obtain the high light output. In contrast, when the accelerating voltage is excessively high, an X ray may be generated easily from the semiconductor light-emitting device 20, and the semiconductor light-emitting device 20 is susceptible to damage due to the energy of the electron beam, which is not preferable.

According to the electron-beam-pumped light source as described above, the electron beam source 30 having the planar electron beam emitting portion 32 and formed of the annular band-shaped member is arranged in the periphery of the semiconductor light-emitting device 20 so as to surround the semiconductor light-emitting device 20. Therefore, the front surface 20a of the semiconductor light-emitting device 20 is irradiated uniformly with the electron beam and hence the high output light may be obtained without increasing the accelerating voltage of the electron beam. In addition, since the light exits from the front surface 20a which the electron beam from the electron beam source 30 in the semiconductor light-emitting device 20 enters, the semiconductor light-emitting device 20 may be cooled from the back surface 20b of the semiconductor light-emitting device 20 via the high-temperature conducting member 16. Therefore, since the semiconductor light-emitting device 20 may be cooled efficiently, lowering of the luminous efficiency of the semiconductor light-emitting device 20 is avoided, and the high output light is maintained.

Also, by keeping the electron radiant quantity emitted from the electron beam emitting portion 32 to 25 mA/cm$^2$ or lower, a high light output may be obtained without increasing the voltage to be applied to the electron beam source 30.

Also, since the surface area of the front surface 32a from which the electron beam of the electron beam emitting portion 32 exits is larger than the surface area of the front surface 20a which the electron beam of the semiconductor light-emitting device 20 enters, the electron beam emitted from the electron beam emitting portion 32 has a high electron density when entering the front surface 20a of the semiconductor light-emitting device 20, so that the higher light output is obtained without increasing the accelerating voltage.

Second Embodiment

Figure 5:
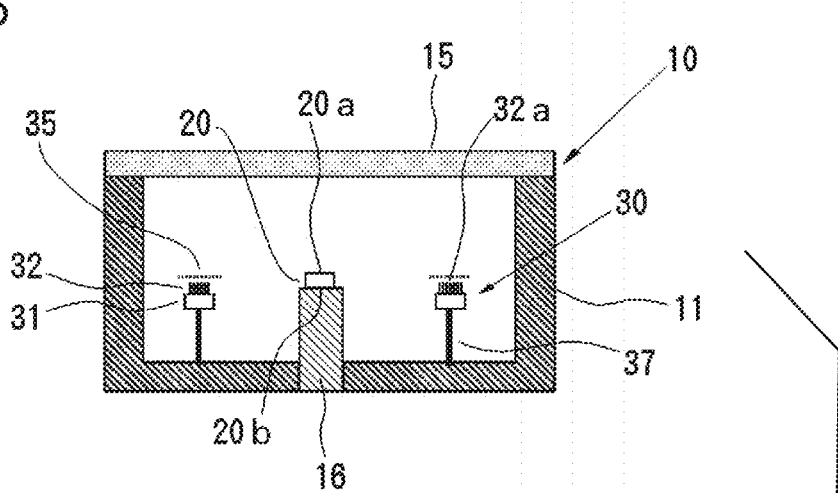
FIG. 5 is an explanatory drawing illustrating a schematic configuration of an electron-beam-pumped light source according to a second embodiment of the present invention, in which (a) is a cross-sectional side view, and (b) is a plan view illustrating a state in which the light transmitting window is removed.
Figure 5:
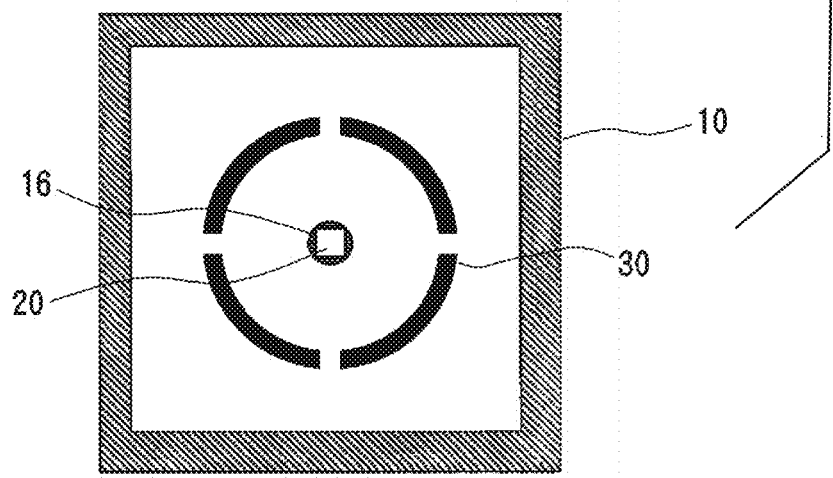

FIG. 5 is an explanatory drawing illustrating a schematic configuration of an electron-beam-pumped light source according to a second embodiment of the present invention, in which (a) is a cross-sectional side view, and (b) is a plan view illustrating a state in which the light transmitting window is removed.

In the electron-beam-pumped light source, a plurality of (four in the illustrated example) electron beam sources 30 each formed with the planar electron beam emitting portion 32 on the supporting substrates 31 are arranged in the peripheral area of the semiconductor light-emitting device 20 so as to surround the semiconductor light-emitting device 20. Specifically, the electron beam sources 30 are each formed of a partial annular band-shaped member, and are arranged so as to surround the semiconductor light-emitting device 20 along the circle having a center at the semiconductor light-emitting device 20 in a posture in which the front surface 32a from which the electron beam of the electron beam emitting portion 32 exits faces the same direction as the front surface 20a of the semiconductor light-emitting device 20, that is, faces the light transmitting window 15 of the vacuum container 10 and, in this state, is fixed to the bottom wall of the container base 11 in the vacuum container 10 via the supporting member 37.

Other detailed configurations are the same as the electron-beam-pumped light source according to the first embodiment.

According to the electron-beam-pumped light source as described above, a plurality of the electron beam sources 30 having the planar electron beam emitting portion 32 and formed of the partial annular band-shaped members are arranged in the periphery of the semiconductor light-emitting device 20 so as to surround the semiconductor light-emitting device 20. Therefore, the front surface 20a of the semiconductor light-emitting device 20 is irradiated uniformly with the electron beam and hence the high output light may be obtained without increasing the accelerating voltage of the electron beam. In addition, since the light exits from the front surface 20a which the electron beam from the electron beam source 30 of the semiconductor light-emitting device 20 enters, the semiconductor light-emitting device 20 may be cooled from the back surface 20b of the semiconductor light-emitting device 20 via the high-temperature conducting member 16. Therefore, since the semiconductor light-emitting device 20 may be cooled efficiently, lowering of the luminous efficiency of the semiconductor light-emitting device 20 is avoided, and the high output light is maintained.

Third Embodiment

Figure 6:
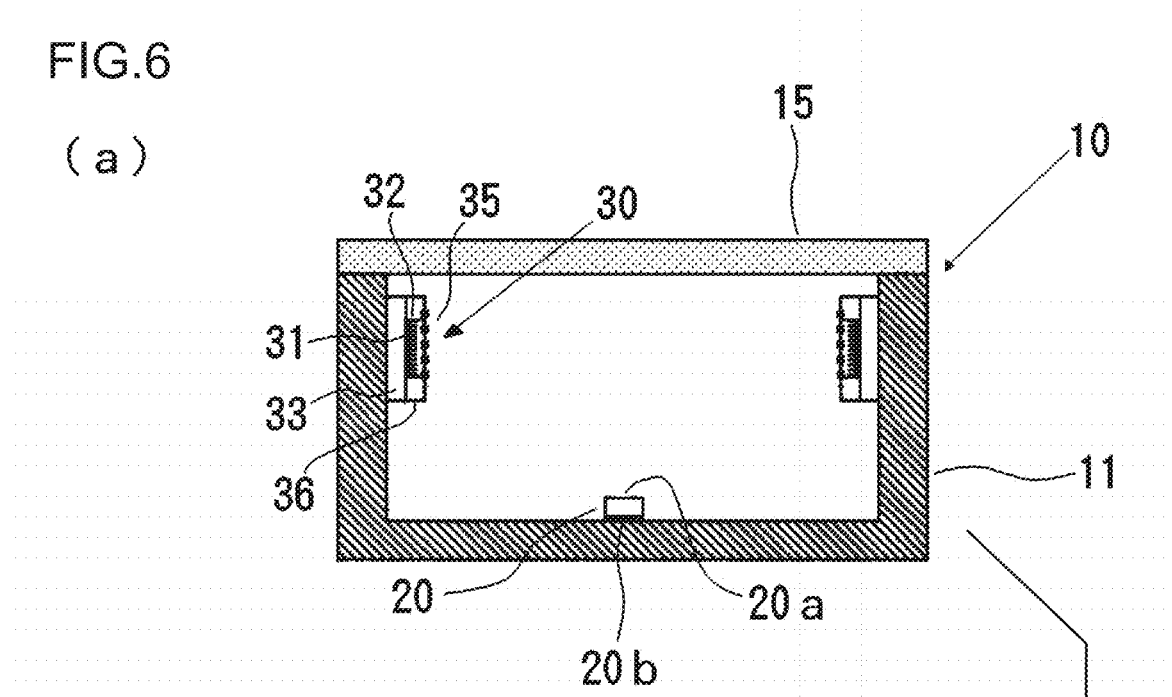
FIG. 6 is an explanatory drawing illustrating a schematic configuration of an electron-beam-pumped light source according to a third embodiment of the present invention, in which (a) is a cross-sectional side view, and (b) is a plan view illustrating a state in which the light transmitting window is removed.
Figure 6:
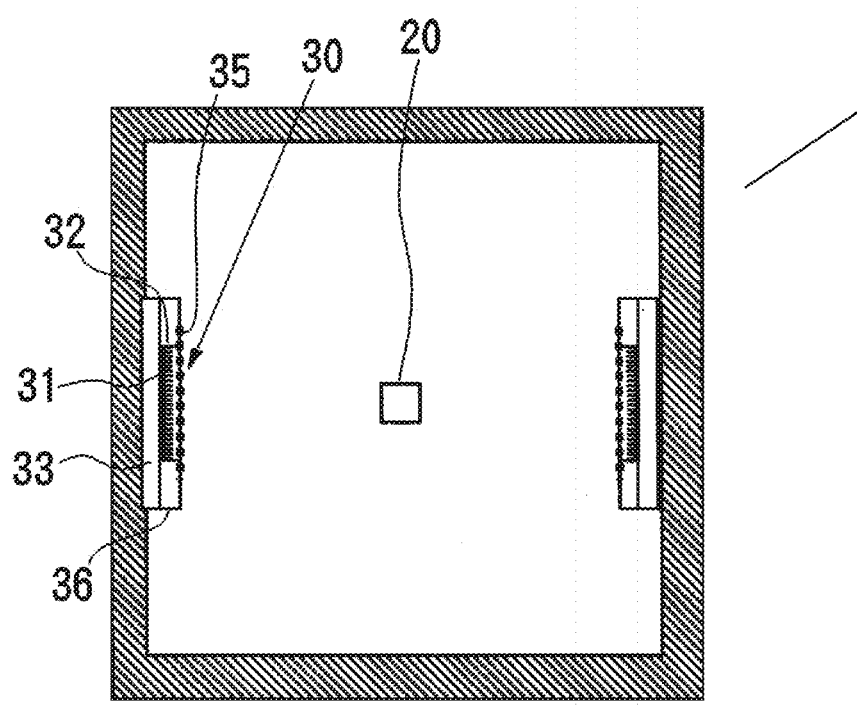

FIG. 6 is an explanatory drawing illustrating a schematic configuration of an electron-beam-pumped light source according to a third embodiment of the present invention, in which (a) is a cross-sectional side view, and (b) is a plan view illustrating a state in which the light transmitting window is removed.

In this electron-beam-pumped light source, the semiconductor light-emitting device 20 is arranged on an inner surface of the bottom wall of the container base 11 in the vacuum container 10 so that the front surface 20a (an upper surface in FIG. 6(a)) faces the light transmitting window 15 at a distance therefrom, and a plurality of (two in the illustrated example) electron beam sources 30 each formed with the rectangular planar electron beam emitting portion 32 on the rectangular supporting substrates 31 are arranged in the peripheral area of the semiconductor light-emitting device 20 so as to interpose the semiconductor light-emitting device 20 therebetween. More specifically, the electron beam emitting portions 32 of the respective electron beam sources 30 are formed by supporting a number of carbon nanotubes on the supporting substrate 31, and the supporting substrates 31 of the respective electron beam sources 30 are fixed to the plate-shaped bases 33, and the respective bases 33 are fixed to the inner surfaces of the two side surfaces of the container base 11 facing each other, the electron beam sources 30 are arranged respectively so that the electron beam emitting portions 32 face each other at positions interposing the semiconductor light-emitting device 20 therebetween. Other detailed configurations are the same as the electron-beam-pumped light source according to the first embodiment.

According to the electron-beam-pumped light source as described above, the plurality of the electron beam sources 30 having the planar electron beam emitting portion 32 are arranged in the periphery of the semiconductor light-emitting device 20 so as to interpose the semiconductor light-emitting device 20 therebetween. Therefore, the front surface 20a of the semiconductor light-emitting device 20 is irradiated uniformly with the electron beam and hence the high light output may be obtained without increasing the accelerating voltage of the electron beam. In addition, since the light exits from the front surface 20a which the electron beam from the electron beam sources 30 in the semiconductor light-emitting device 20 enters, the semiconductor light-emitting device 20 may be cooled from the back surface 20b of the semiconductor light-emitting device 20. Therefore, since the semiconductor light-emitting device 20 may be cooled efficiently, lowering of the luminous efficiency of the semiconductor light-emitting device 20 is avoided, and the high light output is maintained.

Fourth Embodiment

Figure 7:
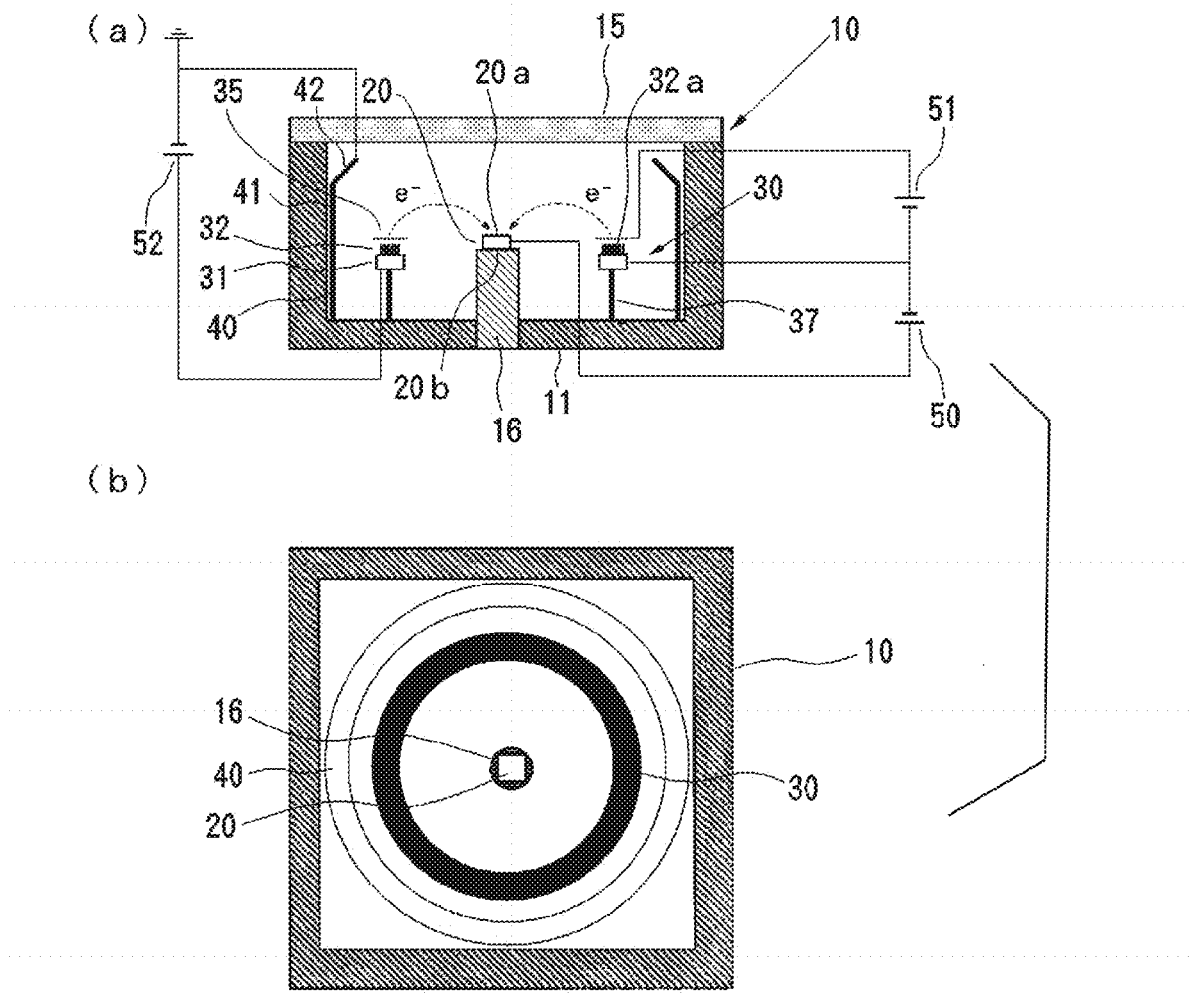
FIG. 7 is an explanatory drawing illustrating a schematic configuration of an electron-beam-pumped light source according to a fourth embodiment of the present invention, in which (a) is a cross-sectional side view, and (b) is a plan view illustrating a state in which the light transmitting window is removed.

FIG. 7 is an explanatory drawing illustrating a schematic configuration of an electron-beam-pumped light source according to a fourth embodiment of the present invention, in which (a) is a cross-sectional side view, and (b) is a plan view illustrating a state in which the light transmitting window is removed.

The electron-beam-pumped light source includes the vacuum container 10 being sealed in a hermetic manner in a state of a negative pressure in the interior thereof and having an outline of a parallelepiped, and includes the container base 11 having an opening on one surface (an upper surface in FIG. 7(a)), and the light transmitting window 15 arranged on the opening of the container base 11 and sealing the container base 11 in an air-tight manner.

The semiconductor light-emitting device 20 is arranged in the vacuum container 10 so that the front surface 20a (an upper surface in FIG. 7(a)) thereof is arranged so as to face the light transmitting window 15 at a distance therefrom, and the electron beam source 30 including the planar electron beam emitting portion 32 formed on the supporting substrate 31 is arranged in a peripheral area of the semiconductor light-emitting device 20, specifically, in an area in the proximity of the semiconductor light-emitting device 20 other than a portion on an area on the front surface 20a and an area on the back surface 20b of the semiconductor light-emitting device 20 so as to surround the semiconductor light-emitting device 20. Specifically, the electron beam sources 30 are each formed of annular band-shaped members, and are arranged so as to surround the semiconductor light-emitting device 20 in a posture in which the front surface 32a of the electron beam emitting portion 32 from which the electron beam exits faces the same direction as the front surface 20a of the semiconductor light-emitting device 20, that is, faces the light transmitting window 15 of the vacuum container 10 and, in this state, is fixed to the bottom wall of the container base 11 in the vacuum container 10 via the supporting member 37. The semiconductor light-emitting device 20 and the electron beam source 30 are electrically connected to electron accelerating means 50 for applying the accelerating voltage provided outside of the vacuum container 10 via a conductive line drawn out from the interior to the outside of the vacuum container 10 so that the semiconductor light-emitting device 20 becomes the positive pole and the electron beam sources 30 becomes the negative pole. Also, the semiconductor light-emitting device 20 is fixed to the bottom wall of the container base 11 of the vacuum container 10 via the high-temperature conducting member 16 provided on the back surface 20b thereof. Detailed configurations of the vacuum container 10, the semiconductor light-emitting device 20 and the electron beam sources 30 are the same as the electron-beam-pumped light source according to the first embodiment.

Then, an electrode for electric field control 40 configured to direct a trajectory of the electron beam emitted from the electron beam sources 30 toward the front surface 20a through which light in the semiconductor light-emitting device 20 exits is arranged at a position outward of the electron beam sources 30 with respect to the semiconductor light-emitting device 20. Specifically, the electrode for electric field control 40 is formed of a cylindrical member including a body portion 41 having an inner diameter larger than the outer diameter of the electron beam sources 30 and a tapered portion 42 formed continuously from the body portion 41 and being reduced in diameter toward a distal end (an upper end in FIG. 7(a)), and is arranged so as to surround the outer periphery of the electron beam sources 30. A proximal end of the electrode for electric field control 40 is fixed to the bottom wall of the container base 11 of the vacuum container 10. The electron beam source 30 and the electrode for electric field control 40 are electrically connected to a power source for electric field control 52 provided outside the vacuum container 10 via a conductive line drawn out from the interior to the outside of the vacuum container 10 so that the electron beam source 30 becomes the positive pole and the electrode for electric field control 40 becomes the negative pole.

Figure 8:
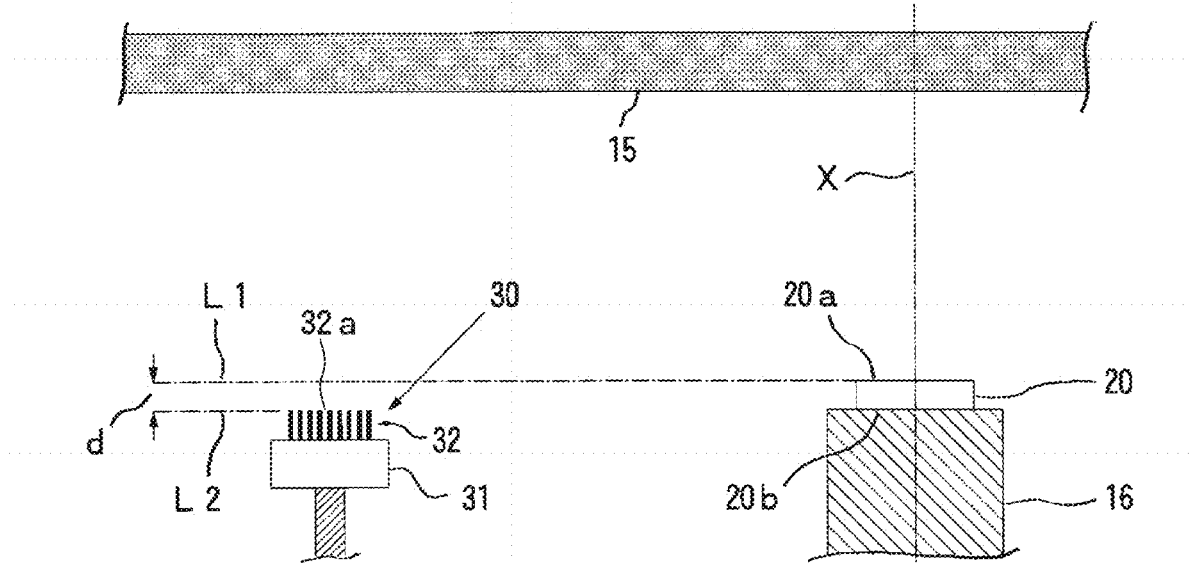
FIG. 8 is an explanatory cross-sectional view illustrating a positional relationship between a semiconductor light-emitting device and an electron beam source in the electron-beam-pumped light source according to the fourth embodiment.

In the electron-beam-pumped light source according to the fourth embodiment, a height L1 of the front surface 20a of the semiconductor light-emitting device 20 which the electron beam enters is preferably a height displaced with respect to a height L2 of the front surface 32a of the electron beam emitting portion 32 of the electron beam sources 30 from which the electron beam exits in the direction of emission of light of the semiconductor light-emitting device 20 (the upward direction in FIG. 7(a) and FIG. 8), that is, a height displaced so as to be closer to the light transmitting window 15 than the front surface 32a of the electron beam emitting portion 32 of the electron beam sources 30 from which the electron beam exits in a normal line direction X of the front surface 20a of the semiconductor light-emitting device 20 as illustrated in FIG. 8. Specifically, a distance (amount of displacement) d between the height L1 of the front surface 20a of the semiconductor light-emitting device 20 and the height L2 of the front surface 32a of the electron beam emitting portion 32 from which the electron beam exits is preferably 2 to 5 mm. In this configuration, the trajectory of the electron beam emitted from the electron beam emitting portion 32 may be controlled easily at a small voltage, and the electron beam may enter the front surface 20a of the semiconductor light-emitting device 20 at a higher efficiency.

As a material which constitutes the electrode for electric field control 40, a metallic material, for example containing any one of iron, nickel, cobalt, chrome, aluminum, silver, copper, titanium, and zirconium may be used.

As an example of dimensions of the electrode for electric field control 40, the inner diameter of the body portion 41 is 34 mm, the length in the axial direction is 12 mm, the inner diameter at the distal end of the tapered portion 42 is 28 mm, the length in the axial direction is 3 mm, the inclination of the tapered portion 42 with respect to the body portion 41 is, for example, 45°, the thickness of the cylindrical member which constitutes the electrode for electric field control 40 is 0.3 mm, and the distance between the height of the surface of the electron beam emitting portion 32 of the electron beam sources 30 from which the electron beam exits and the height at the distal end of the tapered portion 42 is 7 mm.

In the electron-beam-pumped light source described above, when the voltage is applied between the electron beam source 30 and the extraction electrode 35, electrons are discharged from the electron beam emitting portion 32 of the electron beam source 30 toward the extraction electrode 35, and these electrons proceed toward the semiconductor light-emitting device 20 and are accelerated by the accelerating voltage applied between the semiconductor light-emitting device 20 and the electron beam source 30, whereby the electron beam is formed. The trajectory of the electron beam is directed toward the front surface 20a of the semiconductor light-emitting device 20 where the light exits by the voltage applied between the electron beam sources 30 and the electrode for electric field control 40 by the accelerating voltage and the power source for electric field control 52, and, consequently, the electron beam enters the front surface 20a of the semiconductor light-emitting device 20, that is, the surface of the active layer 25. Then, in the semiconductor light-emitting device 20, the electrons of the active layer 25 are excited by the entry of the electron beam, whereby light such as ultraviolet rays exits from the front surface 20a which the electron beam in the semiconductor light-emitting device 20 enters and goes out to the outside of the vacuum container 10 via the light transmitting window 15 of the vacuum container 10.

In the description given thus far, the voltage applied between the electron beam sources 30 and the extraction electrode 35 by the power source for electron beam discharge 51 is preferably from 1 to 5 kV.

Also, the accelerating voltage of the electron beam applied by the electron accelerating means 50 is preferably from 6 to 12 kV.

Also, the voltage applied between the electron beam sources 30 and the electrode for electric field control 40 by the power source for electric field control 52 is, for example, −2 to 2 kV.

Also, the electron radiant quantity emitted from the electron beam emitting portion 32 is preferably 25 mA/cm$^2$ or below, and more preferably, 1 to 15 mA/cm$^2$ and, further preferably, 5 to 10 mA/cm$^2$.

According to the electron-beam-pumped light source as described above, since the trajectory of the electron beam emitted from the electron beam sources 30 may be directed toward the front surface 20a from which light exits by the electrode for electric field control 40, the electron beam may enter the front surface 20a of the semiconductor light-emitting device 20 at a high efficiency, whereby a high light output is obtained without increasing the accelerating voltage of the electron beam. In addition, since the light exits from the front surface 20a of semiconductor light-emitting device 20 through which the electron beam from the electron beam source 30 enters, the semiconductor light-emitting device 20 may be cooled from the back surface 20b of the semiconductor light-emitting device 20 via the high-temperature conducting member 16. Therefore, since the semiconductor light-emitting device 20 may be cooled efficiently, lowering of the luminous efficiency of the semiconductor light-emitting device 20 is avoided, and the high output light is maintained.

Also, since the electron beam source 30 is formed of the annular band-shaped member having the planar electron beam emitting portion 32 and is arranged in the periphery of the semiconductor light-emitting device 20 so as to surround the semiconductor light-emitting device 20, the front surface 20a of the semiconductor light-emitting device 20 is irradiated uniformly with the electron beam.

Also, by keeping the electron radiant quantity emitted from the electron beam emitting portion 32 to 25 mA/cm$^2$ or lower, a high light output may be obtained without increasing the voltage to be applied to the electron beam source 30.

Also, since the surface area of the front surface 32a from which the electron beam of the electron beam emitting portion 32 exits is larger than the surface area of the front surface 20a through which the electron beam of the semiconductor light-emitting device 20 enters, the electron beam emitted from the electron beam emitting portion 32 has a high electron density when entering the front surface 20a of the semiconductor light-emitting device 20, so that the higher light output is obtained without increasing the accelerating voltage.

Fifth Embodiment

Figure 9:
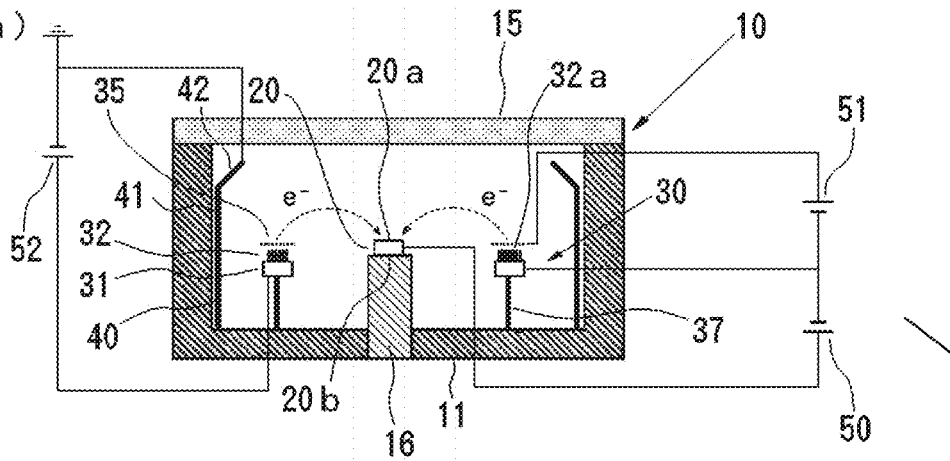
FIG. 9 is an explanatory drawing illustrating a schematic configuration of an electron-beam-pumped light source according to a fifth embodiment of the present invention, in which (a) is a cross-sectional side view, and (b) is a plan view illustrating a state in which the light transmitting window is removed.
Figure 9:
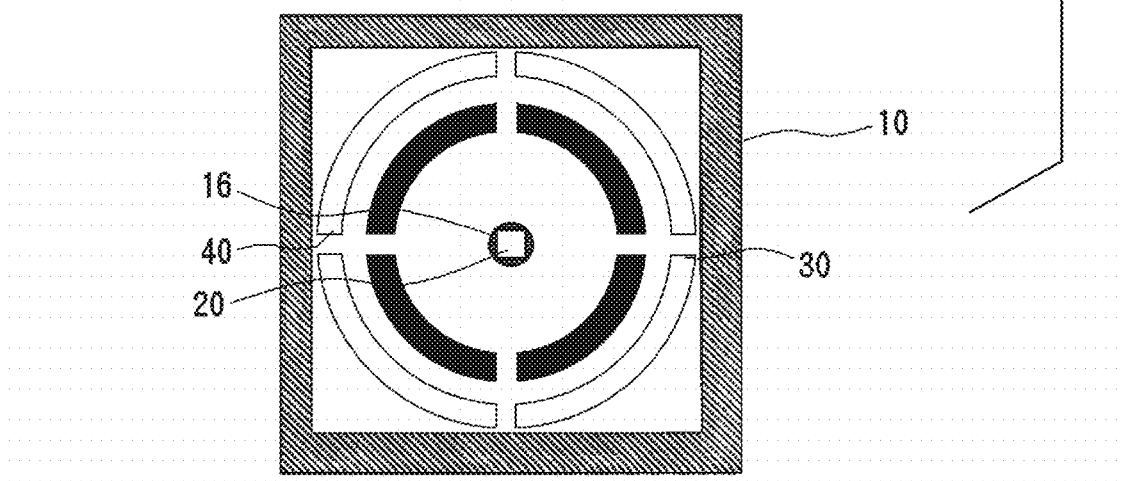

FIG. 9 is an explanatory drawing illustrating a schematic configuration of an electron-beam-pumped light source according to a fifth embodiment of the present invention, in which (a) is a cross-sectional side view, and (b) is a plan view illustrating a state in which the light transmitting window is removed.

In the electron-beam-pumped light source, a plurality of (four in the illustrated example) the electron beam sources 30 each formed with the planar electron beam emitting portion 32 on the supporting substrates 31 are arranged in the peripheral area of the semiconductor light-emitting device 20 so as to surround the semiconductor light-emitting device 20. Specifically, the electron beam sources 30 are each formed of the partial annular band-shaped member, and are arranged so as to surround the semiconductor light-emitting device 20 along the circle having a center at the semiconductor light-emitting device 20 in a posture in which the front surface 32a of the electron beam emitting portion 32 from which the electron beam exits faces the same direction as the front surface 20a of the semiconductor light-emitting device 20, that is, faces the light transmitting window 15 of the vacuum container 10 and, in this state, is fixed to the bottom wall of the container base 11 in the vacuum container 10 via the supporting member 37.

Also, a plurality of electrodes for electric field control 40 configured to direct trajectories of the electron beams emitted from the electron beam sources 30 toward the front surface 20a of the semiconductor light-emitting device 20 from which light exits are arranged at positions outward of the respective electron beam sources 30 with respect to the semiconductor light-emitting device 20 corresponding to the respective electron beam sources 30. More specifically, the respective electrodes for electric field control 40 are formed of partial cylindrical members including the body portion 41 having an inner surface of which a radius of curvature is larger than a radius of curvature of the outer surface of the electron beam sources 30 and the tapered portions 42 being reduced in diameter toward a distal end (an upper end in FIG. 9(a)) formed continuously from the body portion 41, and are arranged so as to surround the four electron beam sources 30 along a circle having a center at the semiconductor light-emitting device 20. Proximal ends of the electrodes for electric field control 40 are fixed to the bottom wall of the container base 11 of the vacuum container 10. The electron beam sources 30 and the electrodes for electric field control 40 are electrically connected to the power source for electric field control 52 provided outside the vacuum container 10 via a conductive line drawn out from the interior to the outside of the vacuum container 10 so that the electron beam source 30 becomes the positive pole and the electrodes for electric field control 40 become the negative pole.

Other detailed configurations are the same as the electron-beam-pumped light source according to the fourth embodiment.

According to the electron-beam-pumped light source as described above, since the trajectory of the electron beam emitted from the respective electron beam sources 30 may be directed toward the front surface 20a of the semiconductor light-emitting device 20 from which light exits by the respective electrodes for electric field control 40, the electron beam may enter the front surface 20a of the semiconductor light-emitting device 20 at a high efficiency, whereby a high light output is obtained without increasing the accelerating voltage of the electron beam. In addition, since the light exits from the front surface 20a which the electron beam from the respective electron beam sources 30 of semiconductor light-emitting device 20 enters, the semiconductor light-emitting device 20 may be cooled from the back surface 20b of the semiconductor light-emitting device 20 via the high-temperature conducting member 16. Therefore, since the semiconductor light-emitting device 20 may be cooled efficiently, lowering of the luminous efficiency of the semiconductor light-emitting device 20 is avoided, and the high light output is maintained.

Also, since the respective electron beam sources 30 are formed of the partial annular band-shaped members having the planar electron beam emitting portion 32 and are arranged in the periphery of the semiconductor light-emitting device 20 so as to surround the semiconductor light-emitting device 20, the front surface 20a of the semiconductor light-emitting device 20 is irradiated uniformly with the electron beam.

Other Embodiments

Although the embodiments of the electron-beam-pumped light source of the present invention have been described, the present invention is not limited to the above-described embodiments, and various modifications may be made as described below.

In the electron-beam-pumped light source of the present invention, the detailed shape of the electron beam source is not specifically limited as long as a planar electron beam emitting portion is provided and, for example, a rectangular plate shape or other shapes are also applicable.

Figure 10:
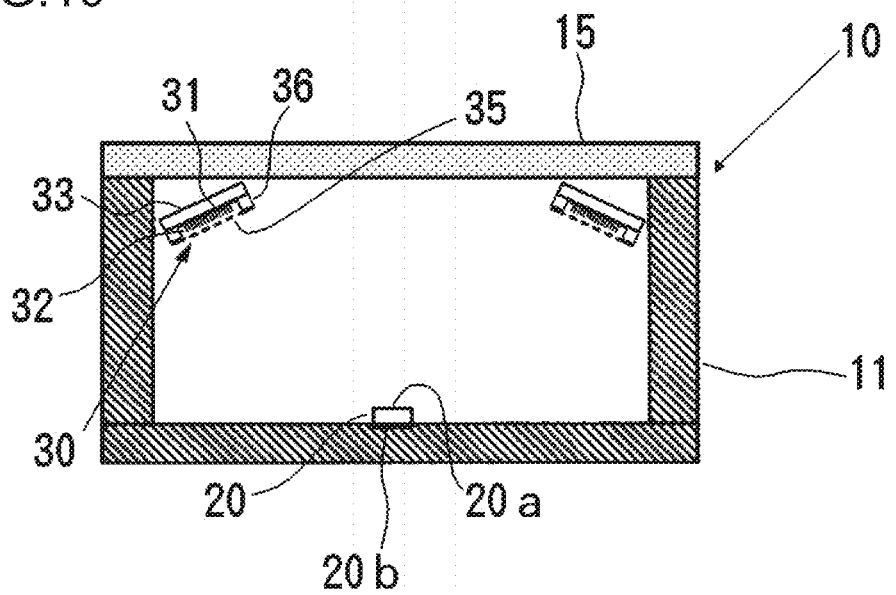
FIG. 10 is an explanatory cross-sectional view illustrating a schematic configuration of a modification of the electron-beam-pumped light source according to the third embodiment.

Also, the position of arrangement of the electron beam source is not specifically limited as long as it is in the periphery of the semiconductor light-emitting device, and the electron beam can enter the light-emitting surface of the semiconductor light-emitting device. In the electron-beam-pumped light source according to the third embodiment, for example, the electron beam sources 30 may be arranged so that the electron beam emitting portion 32 is directed toward the semiconductor light-emitting device 20 at a position interposing the semiconductor light-emitting device 20 therebetween as illustrated in FIG. 10.

Also, the electron beam emitting portion 32 of the electron beam source 30 is not limited to those formed of a carbon nanotube, and those having various configurations may be used as long as they have a planar shape.

Also, in a case where the electrode for electric field control 40 is provided, formation of the tapered portion 42 on the electrode for electric field control 40 is not essential, and for example, a cylindrical shape having an outer diameter and an inner diameter uniform in the axial direction is also applicable.

Also, the electrode for electric field control 40 may include a first electrode member 40a and a second electrode member 40b divided into upper and lower halves as illustrated in FIG. 11. In the electrode for electric field control 40 of such a configuration, a larger voltage is preferably applied to the second electrode member 40b on the upper side than to the first electrode member 40a on the lower side, whereby the trajectory of the electron beam emitted from the electron beam sources 30 can be directed reliably toward the front surface 20a of the semiconductor light-emitting device 20 from which light exits and, consequently, the electron beam may enter the front surface 20a of the semiconductor light-emitting device 20 in a higher efficiency.

Also, the electrode for electric field control 40 may be arranged inward of the electron beam sources 30 with respect to the semiconductor light-emitting device 20, and in this case, a positive voltage is applied to the electron beam sources 30. However, the electrode for electric field control 40 is preferably arranged outward of the electron beam sources 30 with respect to the semiconductor light-emitting device 20 in that the electron beam can enter the semiconductor light-emitting device 20 in a high efficiency.

REFERENCE SIGNS LIST 10 vacuum container
11 container base
15 light transmitting window
16 high-temperature conducting member
20 semiconductor light-emitting device
20a front surface
20b back surface
21 substrate
22 buffer layer
25 active layer
26 quantum well layer
27 barrier layer
30 electron beam source
31 supporting substrate
32 electron beam emitting portion
32a front surface
33 base
35 extraction electrode
36 electrode holding member
37 supporting member
40 electrode for electric field control
40a first electrode member
40b second electrode member
41 body portion
42 tapered portion
50 electron accelerating means
51 power source for electron beam discharge
52 power source for electric field control
80 vacuum container
81 light transmitting window
82 semiconductor light-emitting device
83, 84 light reflecting member
85 laser structure
86 electron beam source
87 electron accelerating means

The invention claimed is:
1. An electron-beam-pumped light source comprising:
an electron beam source; and
a semiconductor light-emitting device excited by an electron beam emitted from the electron beam source, wherein
the electron beam source includes a planar electron beam emitting portion and arranged in the periphery of the semiconductor light-emitting device, light exits from a surface which the electron beam from the electron beam source of the semiconductor light-emitting device enters, and the electron beam source is arranged so as to surround the semiconductor light-emitting device.

2. The electron-beam-pumped light source according to claim 1, wherein the electron beam emitting portion is formed of a carbon nanotube.

3. The electron-beam-pumped light source according to claim 1, wherein the electron beam source is formed of an annular band-shaped member surrounding the semiconductor light-emitting device.

4. The electron-beam-pumped light source according to claim 1, wherein a plurality of the electron beam sources are arranged so as to interpose the semiconductor light-emitting device therebetween.

5. The electron-beam-pumped light source according to claim 1, wherein a plurality of the electron beam sources including partial annular band-shaped members respectively are arranged so as to surround the semiconductor light-emitting device.

6. The electron-beam-pumped light source according to claim 1, further comprising:

an electrode for electric field control configured to direct a trajectory of the electron beam emitted from the electron beam source toward a surface of the semiconductor light-emitting device from which light exits.

7. The electron-beam-pumped light source according to claim 6, wherein a height of the surface of the semiconductor light-emitting device which the electron beam enters is a height displaced from the surface of the electron beam emitting portion from which the electron beam emits in the direction of emission of the light from the semiconductor light-emitting device.

8. The electron-beam-pumped light source according to claim 6, wherein the electrode for electric field control is arranged outward of the electron beam source with respect to the semiconductor light-emitting device, and a negative voltage is applied to the electron beam source.

9. The electron-beam-pumped light source according to claim 1, wherein electron radiant quantity emitted from the electron beam emitting portion is 25 mA/cm$^2$ or smaller.

10. The electron-beam-pumped light source according to claim 9, wherein the surface area of a surface of the electron beam emitting portion from which the electron beam exits is larger than the surface area of the surface of the semiconductor light-emitting device which the electron beam enters.

11. The electron-beam-pumped light source according to claim 2, wherein the electron beam source is arranged so as to surround the semiconductor light-emitting device.

* * * * *